(12) United States Patent
Conell et al.

(10) Patent No.: US 10,838,008 B2
(45) Date of Patent: Nov. 17, 2020

(54) BATTERY SWITCH TESTING SYSTEM AND METHOD

(71) Applicant: GM GLOBAL TECHNOLOGY OPERATIONS LLC, Detroit, MI (US)

(72) Inventors: Jonathan O. Conell, Sterling Heights, MI (US); Robert A. De Stefano, Macomb, MI (US); Dave G. Rich, Shelby Township, MI (US); Benjamin G. Wroblewski, Ferndale, MI (US); Saad Hasan, Detroit, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 145 days.

(21) Appl. No.: 16/034,782

(22) Filed: Jul. 13, 2018

(65) Prior Publication Data
US 2020/0018796 A1 Jan. 16, 2020

(51) Int. Cl.
| | |
|---|---|
| *G01R 31/36* | (2020.01) |
| *B60R 16/033* | (2006.01) |
| *G01R 31/364* | (2019.01) |
| *G01R 31/385* | (2019.01) |
| *G05D 1/02* | (2020.01) |

(52) U.S. Cl.
CPC ........ *G01R 31/3647* (2019.01); *B60R 16/033* (2013.01); *G01R 31/364* (2019.01); *G01R 31/385* (2019.01); *G05D 1/021* (2013.01)

(58) Field of Classification Search
None
See application file for complete search history.

(56) References Cited

U.S. PATENT DOCUMENTS

2016/0288651 A1* 10/2016 Kinoshita ............... B60L 11/12
2019/0115175 A1* 4/2019 Saito .................... H01H 47/002

* cited by examiner

*Primary Examiner* — Jonathan M Dager
*Assistant Examiner* — Garrett F Evans

(57) ABSTRACT

One general aspect includes a battery switch testing method, the method implemented in a system including first and second batteries and a controller, the method including: (a) monitoring, via the controller, electrical properties of the first battery; (b) when the electrical properties of the first battery falls below a threshold value, via the controller, opening a switch of the first battery; (c) closing, via the controller, the first battery switch; (d) monitoring, via the controller, electrical properties of the second battery; (e) when the electrical properties of the second battery falls below a threshold value, via the controller, opening a switch of the second battery; and (f) closing, via the controller, the second battery switch.

20 Claims, 4 Drawing Sheets

Legend:
100: Vehicle
102: Battery Test System
101: Controller
103: One or More Batteries
104: First Battery
105: Wires
106: Second Battery
108: Body
109: Serial Bus
110: Drive System Compartment
112: Wheels
114: Drive System
115: Electric Power
116(a)-116(n): Load Components
118: First Battery Contactor
120: Second Battery Contactor Legend:
100: Vehicle
102: Battery Test System
101: Controller
103: One or More Batteries
104: First Battery
105: Wires
106: Second Battery
108: Body
109: Serial Bus
110: Drive System Compartment
112: Wheels
114: Drive System
115: Electric Power
116(a)-116(n): Load Components
118: First Battery Contactor
120: Second Battery Contactor

BATTERY SWITCH TESTING SYSTEM AND METHOD

In certain types of vehicles, for example, those of the autonomous variety, such vehicles periodically perform safety function checks that require a full open and close cycle of their battery switches (e.g., contactors) so as to verify device functionality. This open-closed cycle also ensures that power provided to the vehicle systems will be limited as well as to help avoid aging of the battery's switch. However, many vehicle systems require continuous power and when power stops during the open-closed cycle, the systems can become damaged or otherwise lose important information. It is therefore desirable to provide a system and method that will allow for safety function checks of vehicle battery switches which will not cut off power to other vehicle systems.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a battery switch testing method, the method implemented in a system including first and second batteries and a controller, the method including: (a) monitoring, via the controller, electrical properties of the first battery; (b) when the electrical properties of the first battery falls below a threshold value, via the controller, opening a switch of the first battery; (c) closing, via the controller, the first battery switch; (d) monitoring, via the controller, electrical properties of the second battery; (e) when the electrical properties of the second battery falls below a threshold value, via the controller, opening a switch of the second battery; and (f) closing, via the controller, the second battery switch. Other embodiments of this aspect include corresponding computer systems, apparatus, and computer programs recorded on one or more computer storage devices, each configured to perform the actions of the methods.

Implementations may include one or more of the following features. The method further including, between steps (b) and (c): (g) verifying, via the controller, the first battery switch is open; and (h) verifying, via the controller, electrical properties of the first battery having an open first battery switch. The method further including, between steps (e) and (f): (i) verifying, via the controller, the second battery switch is open; and (j) verifying, via the controller, the electrical properties of the second battery having an open second battery switch. The method where the system further including a memory and the method further including (k) storing to the memory as test results, via the controller, the results from steps (g), (h), (i), and (j). The method where the system is located in a vehicle. The method where the method is implemented after the vehicle has entered a key-down cycle. The method where the method is implemented before one or more load components of the vehicle enter a quiescent state. The method further including, after step (k): (l) determining, via the controller, whether the first battery switch and second battery switch can function properly during a subsequent vehicle ignition cycle based on the test results from step (k); and (m) limiting, via the controller, vehicle operations when it is determined that either the first battery switch or second battery switch cannot function properly during the subsequent vehicle ignition cycle. The method where the controller is a fail operational control module. Implementations of the described techniques may include hardware, a method or process, or computer software on a computer-accessible medium.

One general aspect includes a battery switch testing method, the method implemented in a vehicle including first and second batteries, a memory, and a fail operational control module (FOCM), the method being implemented after the vehicle has entered a key-down cycle and before one or more load components of the vehicle enter a quiescent state, the method including: (a) monitoring, via the FOCM, current discharge from the first battery; (b) when the current discharge from the first battery falls below a threshold value, via the FOCM, opening a switch of the first battery; (c) verifying, via the FOCM, the first battery switch is open; (d) verifying, via the FOCM, the current discharge from the first battery having an open first battery switch; (e) closing, via the FOCM, the first battery switch; (f) monitoring, via the FOCM, current discharge from the second battery; (g) when the current discharge from the second battery falls below a threshold value, via the FOCM, opening a switch of the second battery; (h) verifying, via the FOCM, the second battery switch is open; (i) verifying, via the FOCM, the current discharge from the second battery having an open second battery switch; (j) closing, via the FOCM, the second battery switch; and (k) storing to the memory as test results, via the FOCM, the results from steps (c), (d), (h), and (i). Other embodiments of this aspect include corresponding computer systems, apparatus, and computer programs recorded on one or more computer storage devices, each configured to perform the actions of the methods.

Implementations may include one or more of the following features. The method further including, after step (k) and before a subsequent vehicle ignition cycle: (l) determining, via the FOCM, whether the first battery switch and second battery switch can function properly during the subsequent vehicle ignition cycle based on the test results from step (k); and (m) limiting, via the FOCM, vehicle operations when it is determined that either the first battery switch or second battery switch cannot function properly during the subsequent vehicle ignition cycle. Implementations of the described techniques may include hardware, a method or process, or computer software on a computer-accessible medium.

One general aspect includes a battery switch testing system including: a memory configured to include one or more executable instructions and a controller configured to execute the executable instructions, where the executable instructions enable the controller to carry out multiple steps in the following order: (a) monitor current discharge from a first battery; (b) when the current discharge from the first battery falls below a threshold value, open a switch of the first battery; (c) close the first battery switch, (d) monitor current discharge from a second battery; (e) when the current discharge from the second battery falls below a threshold value, open a switch of the second battery; and (f) close the second battery switch. Other embodiments of this aspect include corresponding computer systems, apparatus, and computer programs recorded on one or more computer storage devices, each configured to perform the actions of the methods.

Implementations may include one or more of the following features. The system where the executable instructions further enable the controller to carry out the following steps, between steps (b) and (c): (g) verify the first battery switch is open; and (h) verify the current discharge from the first battery having an open first battery switch. The system where the executable instructions further enable the controller to carry out the following steps, between steps (e) and (f): (i) verify the second battery switch is open; and (j) verify the current discharge from the second battery having an open second battery switch. The system where the executable instructions further enable the controller to carry out the following step (k) store to the memory, as test results, the results from steps (g), (h), (i), and (j). The system where the system is located in a vehicle. The system where the controller carries out the steps after the vehicle has entered a key-down cycle. The system where the controller carries out the steps before one or more load components of the vehicle enter a quiescent state. The system where the executable instructions further enable the controller to carry out the following steps, after step (k) and before a subsequent vehicle ignition cycle: (l) determine whether the first battery switch and second battery switch can function properly during the subsequent vehicle ignition cycle based on the test results of step (k); and (m) limit vehicle operations when it is determined that either the first battery switch or second battery switch cannot function properly during the subsequent vehicle ignition cycle. The system where the controller is a fail operational control module. Implementations of the described techniques may include hardware, a method or process, or computer software on a computer-accessible medium.

The above features and advantages and other features and advantages of the present teachings are readily apparent from the following detailed description for carrying out the teachings when taken in connection with the accompanying drawings.

BRIEF DESCRIPTION OF THE DRAWINGS

The disclosed examples will hereinafter be described in conjunction with the following drawing figures, wherein like numerals denote like elements, and wherein.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present system and/or method. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
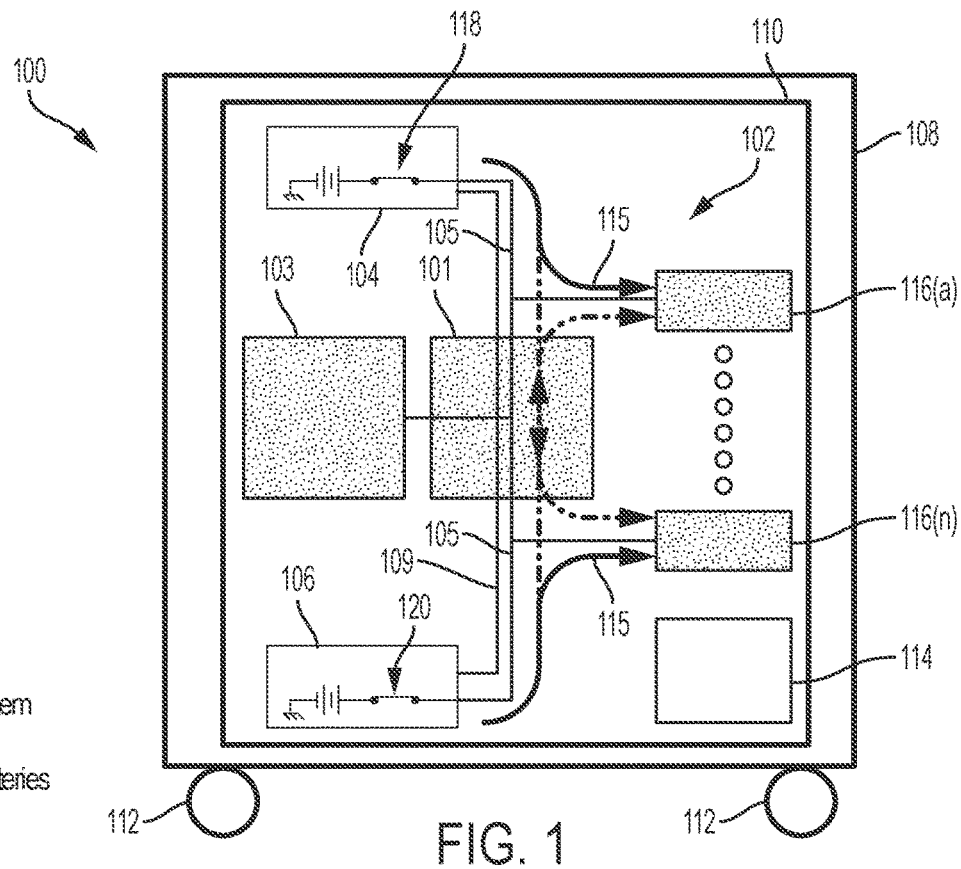
FIG. 1 is a functional block diagram of an exemplary battery contactor testing system being implemented in a vehicle, in accordance with exemplary embodiments.

FIG. 1 illustrates a vehicle 100 having a battery contactor testing system 102 for the low-impact testing of battery contact devices on vehicles 100 having a controller 101, memory 103, at least two installed batteries, a first battery 104 and a second battery 106, and all of which being connected via one or more power distribution wires 105 as well as a serial bus 109 (e.g., a LIN or CAN network). Moreover, in various embodiments, the vehicle 100 includes a body 108 and a drive system compartment 110 disposed within the body 108 as well as one or more wheels 112 and a drive system 114. In various embodiments, the vehicle 100 includes an automobile. The vehicle 100 may be any one of a number of distinct types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD), and/or various other types of vehicles in certain embodiments. In certain embodiments, the battery contactor testing system 102 may be implemented in connection with one or more diverse types of vehicles, and/or in connection with one or more diverse types of systems and/or devices, such as computers, boats, aircraft, spacecraft, or motorcycles. In certain embodiments, the battery contactor testing system 102 may be implemented in connection with one or more diverse types of vehicle architectures such as those associated with autonomous vehicles or comprehensive safety adaptive vehicles (CSAV).

In various embodiment, the central host controller 101 essentially controls the overall operation and function of battery contactor testing system 102. Upon reading and executing one or more executable instructions, controller 101 may control, send, and/or receive information from one or more of memory 103, first battery 104, and second battery 106 and may receive this information via the bus 109. Controller 101 may be part of a Fail Operational Control Module (FOCM) and which includes one of, but is not limited to, a processor, a microprocessor, a central processing unit (CPU), Application Specific Integrated Circuits (ASICs), Field-Programmable Gate Arrays (FPGAs), state machines, and a combination of hardware, software and firmware components.

Memory 103 is configured for recording information, storing information, and retrieving information used by system 102. Memory 103 may include one or more modules of executable instructions configured to be read and executed by controller 101, so as to perform the functions of system 102. Memory 103 may also be controlled by controller 101 to record, store, and retrieve perception information that may include one or more various types of information such as, but not limited test results information resulting from the execution of the battery contactor testing system 102, information on an environment of the vehicle, information of a particular environment in which vehicle is located, information on a vehicle, information on passengers of a vehicle, information on a travel route, timestamp information, etc.

The first battery 104 and second battery 106 may provide stored electric power 115 to one or more of the controller 101, memory 103, drive system 114, and numerous load components 116(a)-116(n) by way of the power distribution lines 105. The first and second batteries 104, 106 may be of the 12-volt variety and include some kind of lithium-ion compositions, lead-acid batteries, NiCd compositions, nickel-metal hydride compositions, Li-ion polymer compositions, zinc-air compositions, and molten-salt compositions or the first and second batteries 104, 106 may also be capacitors or solar energy cells. Moreover, the load components 116(a)-116(n) may include vehicle electronics such as, for example, a vehicle telematics unit, GPS module, one or more vehicle system modules such as, for example, an electronics control module (ECM), body control module (BCM), engine control module, or passive entry passive start module (PEPS), an audio system, microphone, vehicle entertainment system, HVAC fans or blower motors, or vehicle headlamps. In addition, each of the first and second batteries 104, 106 includes an internally integrated switch embodied as a contactor, a first battery contactor 118 and second battery contactor 120, respectively, that is additionally connected to controller 101 via bus 109. The first battery contactor 118 and second battery contactor 120 are electromechanical safety switches that can be controlled by controller 101 and incorporated into their respective first and second batteries 104, 106. For instance, whenever the first and second battery contactor 118, 120 are caused to be in an open state, electrical current from the respective battery 104, 106 will be cut off and thus not delivered to at least the load components 116(a)-116(n) (i.e., to prevent or cut short any vehicle hazards). In certain embodiments, solid-state switches (e.g., Power Field Effect Transistors (FETS)) can be used within either/both the first and second batteries 104, 106 instead of the first battery contactor 118 and/or second battery contactor 120.

In various embodiments, the drive system 114 is mounted on a chassis (not depicted in FIG. 1), and drives the wheels 112. In various embodiments, the drive system 114 includes a propulsion system. In certain exemplary embodiments, the drive system 114 includes an internal combustion engine and/or an electric motor/generator, coupled with a transmission thereof. In certain embodiments, the drive system 114 may vary, and/or two or more drive systems 114 may be used. By way of example, the vehicle 100 may also incorporate any one of, or combination of, a number of distinct types of propulsion systems, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

METHOD

Figure 2:
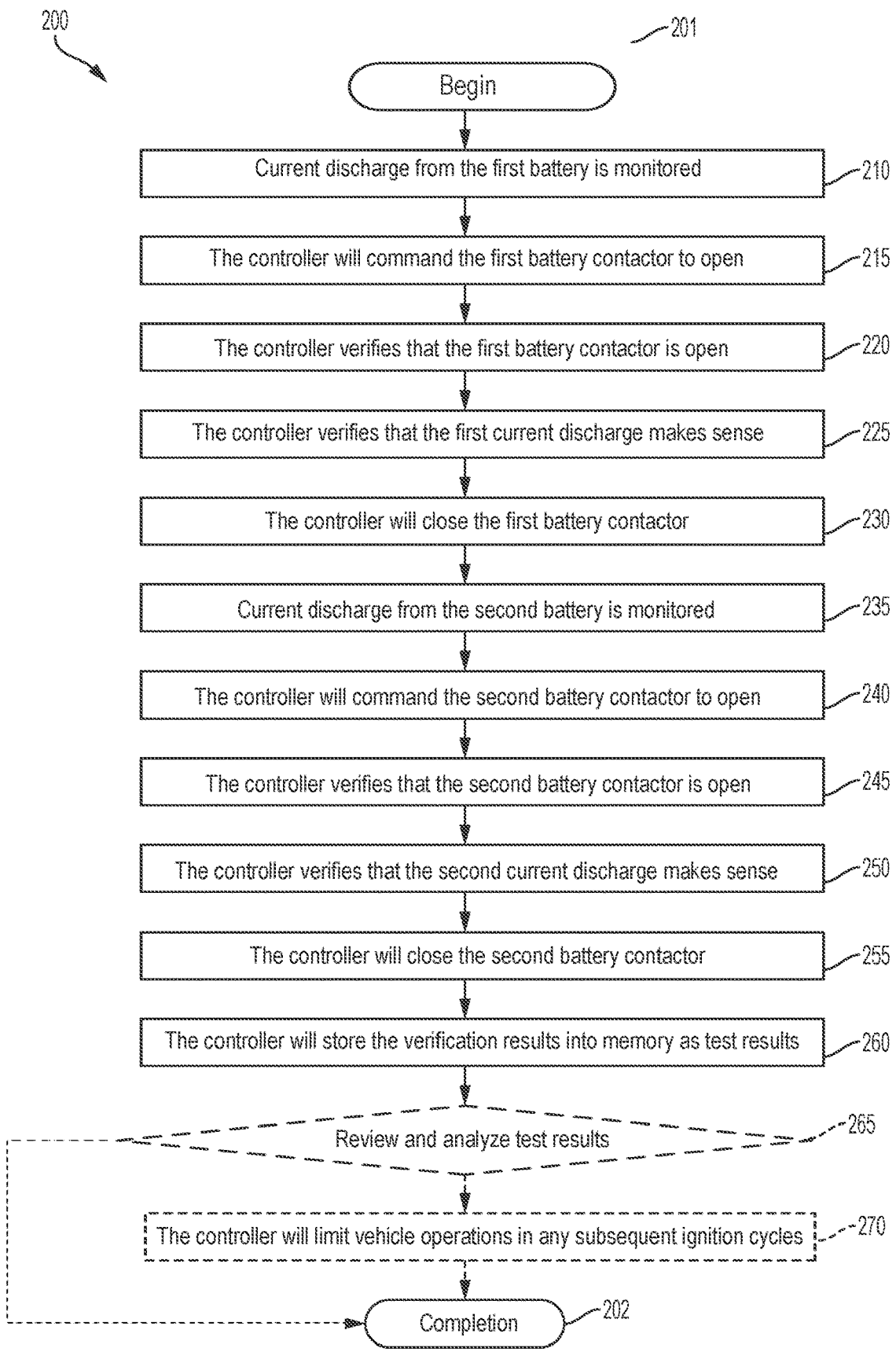
FIG. 2 is a flow chart for an exemplary methodology for battery contactor testing.

Now turning to FIG. 2, there is shown an embodiment of a method 200 to test both the first battery contactor 118 and second battery contactor 120 with low impact on system 102. One or more aspects of transmission method 200 may be completed through controller 101 executing instructions stored in memory 103. In addition, method 200 can be implemented after vehicle 100 has entered a key-down cycle and before one or more vehicle load components 116(a)-116(n) enter a quiescent state. The vehicle key-down cycle occurs, for example, when vehicle 100 transitions from a running state to an OFF state (i.e., when the vehicle has been turned off). In a typical key-down cycle, drive system 114 will turn off and vehicle 100 can enter into a Retained Accessory Power (RAP) mode (which can last, for example, until the driver-side door is opened or for some time duration such as, for example, ten (10) minutes). In addition, during the key-down cycle, communications across serial bus 109 will end and the load components 116(a)-116(n) will begin shutting down and can enter into a quiescent state. Moreover, when the load components 116(a)-116(n) enter this quiescent state they are considered to be in a deep sleep. As follows, typical load components 116(a)-116(n) will consume one hundred (100) micro amps or less while in a quiescent state and, in various embodiments, the combined consumption of the load components 116(a)-116(n) should be between 10 milliamps to 20 milliamps (mA). It should be understood that the key-down cycle is simply the orderly process of the load components 116(a)-116(n) going from an active state while the vehicle is operational to a quiescent state after the vehicle has been turned to the OFF state (and which can take a different amount of time for each load component).

In various embodiments, method 200 begins at 201 when vehicle 100 has entered a key-down cycle. For example, when a vehicle operator (not shown) has pressed the vehicle on/off button or turned the physical key to the off position, the vehicle 100 will broadcast the OFF state via serial data 109 for the load components 116(a)-116(n) to enter their power down sequence. Moreover, once after properly entering the key-down cycle, due to entering their power down sequences, the load components 116(a)-116(n) are still considered at least partially awake (for example—they may require to wake up for periods of time) and therefore consuming power from both the first and second batteries 104, 106 (as can be represented by FIG. 1—wherein electric power arrows 115 from both batteries 104, 106 are shown as entering the load components 116(a)-116(n)).

In step 210, while in the key-down cycle, current discharge from the first battery 104 is monitored. Moreover, in this embodiment, this current can be monitored by controller 101 (e.g., an FOCM) implementing a current sensor that is installed internally in the battery. However, in various embodiments, the current can also be monitored by a Hall effect current sensor (e.g., being attached to the cable of the first battery 104). The current ranges that may be monitored may also be, for example, between −2100 amps to +2100 amps. In various embodiments, the voltage across the first battery contactor 118 can be monitored instead of or in addition to monitoring the current discharge.

Figure 3:
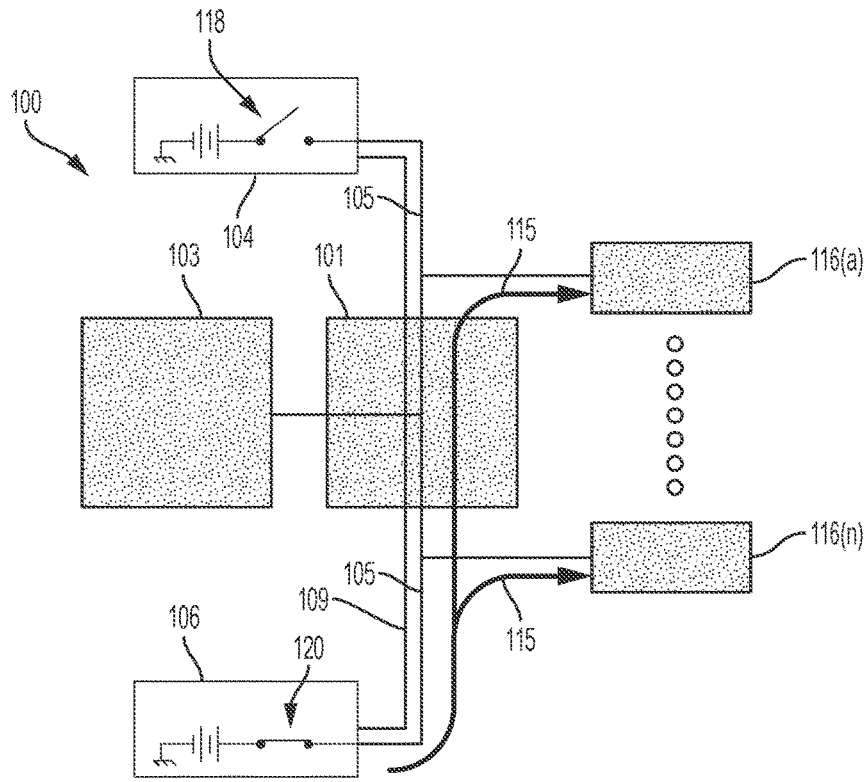
FIG. 3 is a function block diagram of the exemplary battery contactor testing system of FIG. 1 according to an exemplary aspect.

In step 215, with additional reference to FIG. 3, as the load components 116(a)-116(n) consume less power or less load components 116(a)-116(n) consume power (e.g., all systems power down but the internal communications network), the current required to be discharged from the first battery 104 will begin to fall (and so to will the voltage across the first battery contactor 118). For example, over time, the current discharge from the first battery 104 may drop to around five (5) amps from 210 amps. Moreover, when controller 101 sees that the current discharge from this first battery 104 (or voltage across the contactor) has fallen below a threshold value, for example, ten (10) amps, controller 101 will command the first battery contactor 118 to open and create an open circuit such that no current should flow out of the first battery 104. Skilled artists will see this concept being represented in FIG. 3 wherein electric power arrows 115 are only leaving the second battery 106 so as to enter the load components 116(a)-116(n) therefrom). It should be understood that the threshold value of the current is low enough to help reduce wear on the contactor when being opened and that the threshold value for the current can be higher than 10 amps, for example, around 25 amps, with certain technologies (e.g., FET based contactors). It should also be understood that the threshold current value is set to a low enough current value so as to avoid damaging the first battery contact 118 upon being opened. It should be further understood that the load components 116(a)-116(n) will receive uninterrupted power since they are alternately being fed current from the second battery 106.

In step 220, controller 101 will verify that the first battery contactor 118 is, in fact, open. The controller 101 may verify this through one or more sensors installed on the first battery contactor 118 or through software stored on memory 103. In step 225, controller 101 will verify that the current discharge from the first battery 104, having the opened first battery contactor 118, makes sense (i.e., the controller will rationalize this current discharge). For instance, the controller 101 may have monitored the current discharge being at five (5) amps when the first battery contactor 118 was closed and that the current discharge dropped to zero (0) amps (+/− some error) after the first battery contactor 118 was opened. As a result, controller 101 will make sure that the current discharge remains at zero (0) amps and has not returned or will not return to five (5) amps (or some other non-trivial value). Skilled artisans will, for instance, see that one way of conducting this rationalization can be performed by adding redundant A/D converters on the first battery sensor(s) and verifying the outputs of these converters agree.

Figure 4:
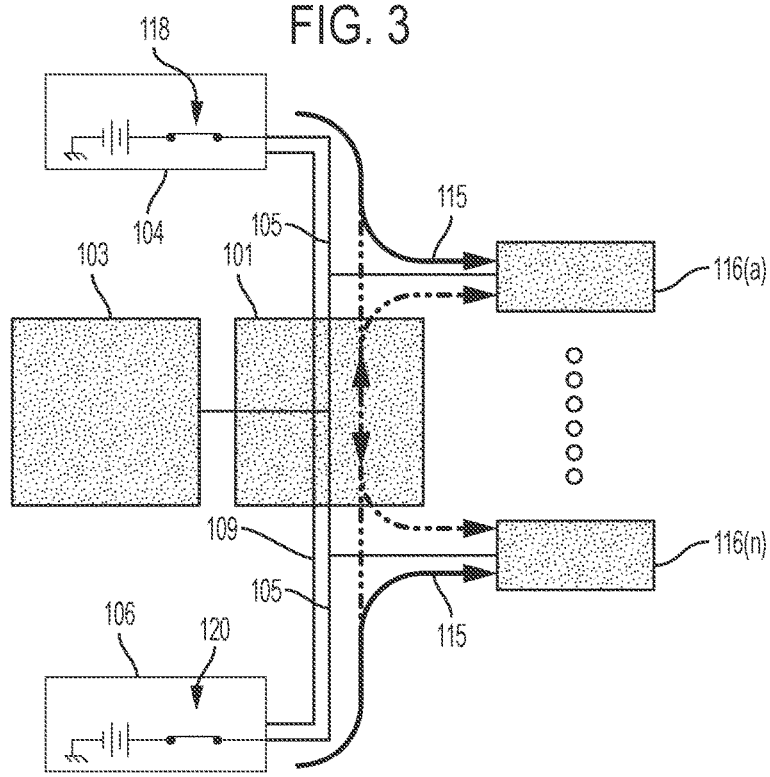
FIG. 4 is a function block diagram of the exemplary battery contactor testing system of FIG. 1 according to another exemplary aspect.

In step 230, with additional reference to FIG. 4, controller 101 will close the first battery contactor 118 and allow the first battery 104 to return to a normal state (i.e., such that current begins again to discharge/flow from the corresponding battery). This concept is represented in FIG. 4 wherein electric power arrows 115 from both batteries 104, 106 are shown as entering the load components 116(a)-116(n)). While current is discharging/flowing from both the first and second batteries, 104, 106, in step 235, controller 101 will begin to monitor the current being discharged from the second battery 106 (e.g., a current flow between −2100 amps to +2100 amps) by a current sensor that is installed internally in the battery (or a Hall sensor in various embodiments). In various embodiments, the voltage across the second battery contactor 120 can be monitored instead of or in addition to monitoring the current discharge.

Figure 5:
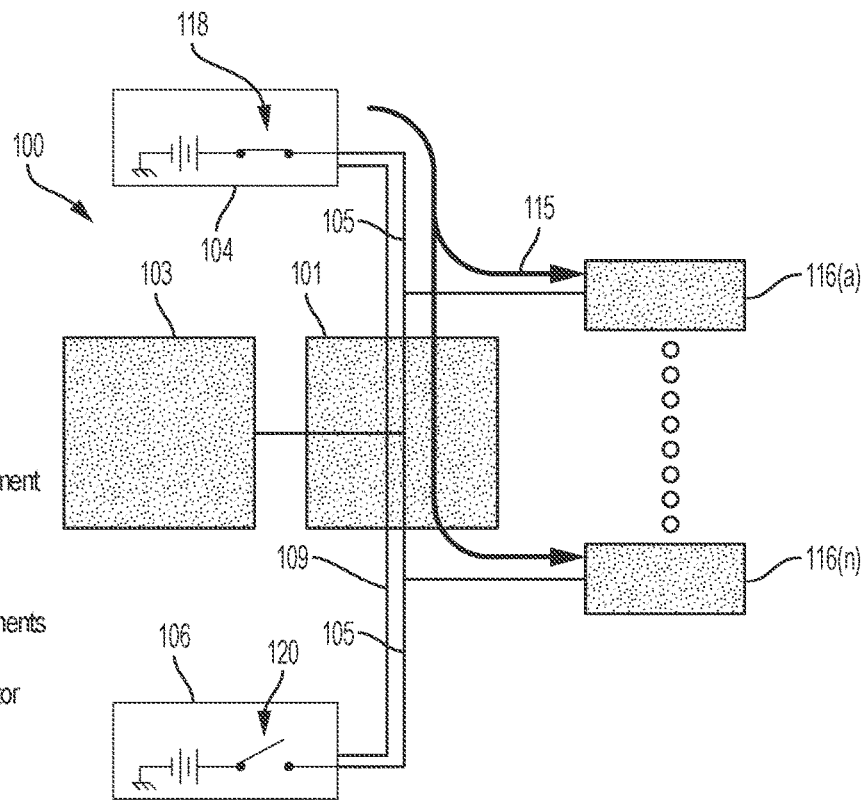
FIG. 5 is a function block diagram of the exemplary battery contactor testing system of FIG. 1 according to another exemplary aspect.

In step 240, with additional reference to FIG. 5, as the current being discharged from the second battery 106 falls below a threshold value (and so to will the voltage across the corresponding contactor 120), for example, 10 amps, controller 101 will command open the second battery contactor 120 so that no current should be discharged. Skilled artists will see this concept being represented in FIG. 5 wherein electric power arrows 115 are only leaving the first battery 104 so as to enter the load components 116(a)-116(n)). It should be understood that the threshold current value should be set to low enough to avoid damaging the second battery contact 120 when opened. It should also be understood that the load components 116(a)-116(n) will still receive uninterrupted power (i.e., from the first battery 106).

Figure 6:
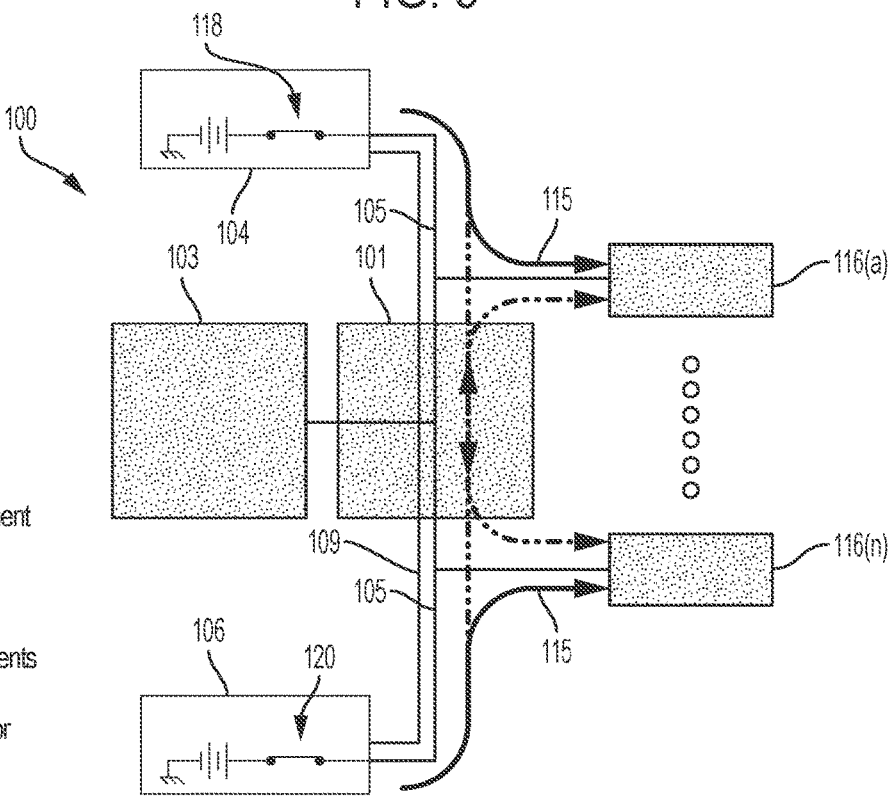
FIG. 6 is a function block diagram of the exemplary battery contactor testing system of FIG. 1 according to another exemplary aspect.

In step 245, controller 101 will verify that the second battery contactor 120 is, in fact, open, in a similar manner as the first battery contactor 118. In step 250, controller 101 will verify that the current discharge from the second battery 106, with the opened second battery contactor 120, makes sense (i.e., controller 101 will make sure that the current discharge remains at zero (0) amps and has not returned to some other non-trivial current), which can also be via redundant A/D connectors In step 255, with additional reference to FIG. 6, controller 101 will close the second battery contactor 120 and allow the second battery 106 to return to a normal state. This concept is represented in FIG. 6 wherein electric power arrows 115 leaving from both batteries 104, 106 are shown as entering the load components 116(a)-116(n). In step 260, controller 101 will store in memory 103 those verification results established in steps 220, 225, 245, and 250 as test results. In essence, these test results are those results from when controller 101 verified whether the contactors 118, 120 were open and from when controller 101 verified whether there was zero (0) current being discharged from the batteries 104, 106 after their contactors 118, 120 were opened. Moreover, these test results may be configured to help controller 101 to, at a later time, determine if either battery contactor 118, 120 has the ability to operate as intended during a subsequent vehicle ignition cycle.

Controller 101 may also set/store any diagnostics for failed tests (i.e., when the contactor does not open and/or current remains to discharge while the contactor is open for some reason) so that the information is not lost for the subsequent ignition cycle/vehicle usage. Moreover, a failed test result can limit the usage of vehicle 100 until the failure is corrected or one or both batteries 104, 106 are replaced, in order to prevent a safety hazard. It should be understood that, in certain embodiments, these test results may be stored in memory 103 directly after the completion of steps 220 and 225 as well as directly after the completion of steps 245 and 250 or after the completion of both sets of steps.

At this point, method 200 may move to completion 202, in which, in certain embodiments, the load components 116(a)-116(n)) enter the quiescent state. Otherwise, method 200 may move to optional steps 265 and 270. In certain embodiments, these optional steps 265 and 270 may occur before the load components 116(a)-116(n)) enter the quiescent state or, in certain embodiment, they may occur after the load components 116(a)-116(n)) enter the quiescent state.

In optional step 265, controller 101 will review and analyze the stored test results to determine whether the first battery contactor 118 and second battery contactor 120 can function properly during the subsequent vehicle ignition cycle. If both contactors 118, 120 can function properly (i.e., the test results verified both contactors opened properly and the current discharge has made sense), then method 200 will move to completion 202. However, if the stored test results show one or both of the first battery contactor 118 and second battery contactor 120 have failed (i.e., failed results), method 200 will move to step 270.

In step 270, controller 101 will limit the vehicle operations in any subsequent ignition cycles. For example, controller 101 may allow one or more of the load components 116(a)-116(n) to operate but will not turn on the drive system 114. Controller 101 may also restrict the drive system 114 from turning back on until one or both batteries 104, 106 have been replaced or one or both contactors 118, 120 have been fixed. After step 270, method 200 will move to completion 202.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the system and/or method that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

None of the elements recited in the claims are intended to be a means-plus-function element within the meaning of 35 U.S.C. § 112(f) unless an element is expressly recited using the phrase "means for," or in the case of a method claim using the phrases "operation for" or "step for" in the claim.

What is claimed is:

1. A battery contactor testing method, the method implemented in a system comprising first and second batteries and a controller, the method comprising:
   (a) monitoring, via the controller, electrical properties of the first battery;
   after step (a), (b) when the electrical properties of the first battery fall below a threshold value, via the controller, opening an internally integrated first battery contactor of the first battery;
   after step (b), (c) closing, via the controller, the first battery contactor;
   after step (c), (d) monitoring, via the controller, electrical properties of the second battery;
   after step (d), (e) when the electrical properties of the second battery fall below a threshold value, via the controller, opening an internally integrated second battery contactor of the second battery; and
   after step (e), (f) closing, via the controller, the second battery contactor.

2. The method of claim 1, further comprising, between steps (b) and (c):
   (g) verifying, via the controller, the first battery contactor is open;
   after step (g), (h) verifying, via the controller, the electrical properties of the first battery having an open first battery contactor; and
   after step (h), (i) verifying, via the controller, the electrical properties of the first battery having an open first battery contactor makes sense.

3. The method of claim 2, further comprising, between steps (e) and (f):
   (j) verifying, via the controller, the second battery contactor is open; and
   after step (j), (k) verifying, via the controller, the electrical properties of the second battery having an open second battery contactor; and
   after step (k), (l) verifying, via the controller, the electrical properties of the second battery having an open second battery contactor makes sense.

4. The method of claim 3, wherein the system further comprising a memory and the method further comprising (m) storing to the memory as test results, via the controller, the results from steps (g), (h), (i), (j), (k), and (l).

5. The method of claim 4, wherein the system is located in a vehicle.

6. The method of claim 5, wherein the method is implemented after the vehicle has entered a key-down cycle.

7. The method of claim 6, wherein the method is implemented before one or more load components of the vehicle enter a quiescent state.

8. The method of claim 7 further comprising, after step (m):
   (n) determining, via the controller, whether the first battery contactor and second battery contactor can function properly during a subsequent vehicle ignition cycle based on the test results from step (m); and
   after step (n), (o) limiting, via the controller, vehicle operations when it is determined that either the first battery contactor or second battery contactor cannot function properly during the subsequent vehicle ignition cycle.

9. The method of claim 1, wherein the controller is a Fail Operational Control Module.

10. A battery contactor testing method, the method implemented in a vehicle comprising first and second batteries, a memory, and a Fail Operational Control Module (FOCM), the method being implemented after the vehicle has entered a key-down cycle and before one or more load components of the vehicle enter a quiescent state, the method comprising:
    (a) monitoring, via the FOCM, current discharge from the first battery;

after step (a), (b) when the current discharge from the first battery falls below a threshold value, via the FOCM, opening an internally integrated first battery contactor of the first battery;

after step (b), (c) verifying, via the FOCM, the first battery contactor is open;

after step (c), (d) verifying, via the FOCM, the current discharge from the first battery having an open first battery contactor;

after step (d), (e) closing, via the FOCM, the first battery contactor;

after step (e), (f) monitoring, via the FOCM, current discharge from the second battery;

after step (f), (g) when the current discharge from the second battery falls below a threshold value, via the FOCM, opening an internally integrated second battery contactor of the second battery;

after step (g), (h) verifying, via the FOCM, the second battery contactor is open;

after step (h), (i) verifying, via the FOCM, the current discharge from the second battery having an open second battery contactor;

after step (i), (j) closing, via the FOCM, the second battery contactor; and after step (j), (k) storing to the memory as test results, via the FOCM, the results from steps (c), (d), (h), and (i).

11. The method of claim 10, further comprising, after step (k) and before a subsequent vehicle ignition cycle:

(l) determining, via the FOCM, whether the first battery contactor and second battery contactor can function properly during the subsequent vehicle ignition cycle based on the test results from step (k); and after step (l), (m) limiting, via the FOCM, vehicle operations when it is determined that either the first battery contactor or second battery contactor cannot function properly during the subsequent vehicle ignition cycle.

12. A battery contactor testing system comprising:

a memory configured to comprise one or more executable instructions and a controller configured to execute the executable instructions, wherein the executable instructions enable the controller to carry out multiple steps in the following order:

(a) monitor current discharge from a first battery;

after step (a), (b) when the current discharge from the first battery falls below a threshold value, open an internally integrated first battery contactor of the first battery;

after step (b), (c) close the first battery contactor;

after step (c), (d) monitor current discharge from a second battery;

after step (d), (e) when the current discharge from the second battery falls below a threshold value, open an internally integrated second battery contactor of the second battery; and after step (e), (f) close the second battery contactor.

13. The system of claim 12, wherein the executable instructions further enable the controller to carry out the following steps, between steps (b) and (c):

(g) verify the first battery contactor is open; and after step (g), (h) verify the current discharge from the first battery having an open second battery contactor; and after step (h), (i) verify the current discharge of the first battery having an open first battery contactor makes sense.

14. The system of claim 13, wherein the executable instructions further enable the controller to carry out the following steps, between steps (e) and (f):

(j) verify the second battery contactor is open; and after (j), (k) verify the current discharge from the second battery having an open second battery switch contactor; and after step (k), (l) verify the current discharge of the second battery having an open second battery contactor makes sense.

15. The system of claim 14, wherein the executable instructions further enable the controller to carry out the following step (m) store to the memory, as test results, the results from steps (g), (h), (i), (j), (k), and (l).

16. The system of claim 15, wherein the system is located in a vehicle.

17. The system of claim 16, wherein the controller carries out the steps after the vehicle has entered a key-down cycle.

18. The system of claim 17, wherein the controller carries out the steps before one or more load components of the vehicle enter a quiescent state.

19. The system of claim 18, wherein the executable instructions further enable the controller to carry out the following steps, after step (m) and before a subsequent vehicle ignition cycle:

(n) determine whether the first battery contactor and second battery contactor can function properly during the subsequent vehicle ignition cycle based on the test results of step (m); and after step (n), (o) limit vehicle operations when it is determined that either the first battery contactor or second battery contactor cannot function properly during the subsequent vehicle ignition cycle.

20. The system of claim 12, wherein the controller is a Fail Operational Control Module.

* * * * *